(12) United States Patent
Liu et al.

(10) Patent No.: US 11,096,309 B2
(45) Date of Patent: Aug. 17, 2021

(54) CHASSIS AND METHOD FOR MANUFACTURING THE SAME

(71) Applicant: EMC IP Holding Company LLC, Hopkinton, MA (US)

(72) Inventors: Fajiang Liu, Shanghai (CN); Wei Dong, Shanghai (CN); Haifang Zhai, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/846,797

(22) Filed: Apr. 13, 2020

(65) Prior Publication Data

US 2020/0344909 A1 Oct. 29, 2020

(30) Foreign Application Priority Data

Apr. 29, 2019 (CN) .......................... 201910355155.X

(51) Int. Cl.
*H05K 7/14* (2006.01)
*H05K 7/20* (2006.01)

(52) U.S. Cl.
CPC ....... *H05K 7/1489* (2013.01); *H05K 7/20727* (2013.01)

(58) Field of Classification Search
CPC ............. H05K 7/1489; H05K 7/20727; H05K 7/1487; H05K 7/20736; H05K 7/1488; H05K 7/1418; H05K 7/1425; H05K 7/14; H05K 7/1424; H05K 7/1427; H05K 7/1439; H05K 7/1445; H05K 1/14; H05K 1/184; H05K 5/0004; H05K 5/0026; H05K 5/0217; H05K 5/026; H05K 5/0286; H05K 7/02; H05K 7/1404; H05K 7/1417; H05K 7/1429; H05K 7/1438; H05K 7/1454; H05K 7/1461; H05K 7/1485; H05K 7/18; H05K 7/183; G06F 1/187; G06F 1/183; G06F 1/181; G06F 1/184; G06F 1/185; G06F 13/4068; G06F 13/409; G06F 1/186; G06F 11/201
See application file for complete search history.

(56) References Cited

U.S. PATENT DOCUMENTS 4,800,463 A * 1/1989 Ferchau ............... H05K 7/1425
211/41.17
5,892,662 A * 4/1999 Verma .................. H05K 7/1425
361/796

(Continued)

*Primary Examiner* — Stephen S Sul
*Assistant Examiner* — Michael A Matey
(74) *Attorney, Agent, or Firm* — BainwoodHuang

(57) ABSTRACT

Techniques involve providing a chassis and for manufacturing the same. The chassis includes a housing and a partition. The partition is disposed within the housing and adapted to partition a space inside the housing into a first accommodating portion and a second accommodating portion. The partition is configured to be detachably mounted within the housing and a position of the partition in the housing is adjustable, to change respective volumes of the first accommodating portion and the second accommodating portion. In this way, a common chassis for different functional configuration demands is implemented, thereby avoiding the waste of space of the chassis due to changes in the volumes of internal electronic components.

17 Claims, 5 Drawing Sheets

(56) References Cited

U.S. PATENT DOCUMENTS

| | | | | |
|---|---|---|---|---|
| 6,078,503 A * | 6/2000 | Gallagher | | G06F 1/16 108/61 |
| 7,224,581 B2 | 5/2007 | Garnett et al. | | |
| 7,344,410 B1 | 3/2008 | Foster, Sr. | | |
| 8,047,383 B2 * | 11/2011 | Hendrix | | H05K 7/1418 211/26 |
| 8,737,058 B2 * | 5/2014 | Xu | | G06F 1/181 361/679.37 |
| 9,167,716 B2 * | 10/2015 | Ma | | H05K 7/1489 |
| 9,625,959 B1 * | 4/2017 | Chen | | G11B 33/125 |
| 9,653,124 B2 | 5/2017 | Heyd et al. | | |
| 2002/0124114 A1 * | 9/2002 | Bottom | | H04L 49/351 709/251 |
| 2005/0083668 A1 * | 4/2005 | Chang | | H05K 7/1445 361/801 |
| 2005/0219833 A1 * | 10/2005 | Wu | | G06F 1/184 361/829 |
| 2005/0257232 A1 * | 11/2005 | Hidaka | | H05K 7/1487 720/654 |
| 2008/0239656 A1 * | 10/2008 | Sasagawa | | G06F 1/187 361/679.37 |
| 2008/0239657 A1 * | 10/2008 | Oyama | | G11B 33/128 361/679.37 |
| 2008/0244052 A1 * | 10/2008 | Bradicich | | G06F 1/183 709/223 |
| 2011/0182030 A1 * | 7/2011 | Mayer | | G06F 1/184 361/679.58 |
| 2013/0009529 A1 * | 1/2013 | Zhu | | G06F 1/187 312/223.2 |
| 2013/0155599 A1 * | 6/2013 | Ross | | G06F 1/187 361/679.31 |
| 2014/0204525 A1 * | 7/2014 | Pecone | | G06F 1/187 361/679.33 |
| 2014/0247569 A1 * | 9/2014 | Foisy | | G06F 1/16 361/759 |
| 2015/0009639 A1 * | 1/2015 | Papakos | | H05K 7/1427 361/752 |
| 2015/0293566 A1 * | 10/2015 | Ehlen | | H05K 7/20718 361/679.33 |
| 2016/0073544 A1 * | 3/2016 | Heyd | | G06F 1/187 361/679.31 |
| 2016/0189506 A1 * | 6/2016 | Peterson | | G08B 13/08 340/551 |
| 2016/0234962 A1 * | 8/2016 | Shinsato | | G11B 33/128 |
| 2017/0127550 A1 * | 5/2017 | Heinrichs | | H05K 7/1438 |
| 2017/0150621 A1 * | 5/2017 | Breakstone | | G11B 33/142 |
| 2017/0168975 A1 * | 6/2017 | Heinrichs | | H05K 7/1492 |
| 2017/0202111 A1 * | 7/2017 | Huang | | H05K 7/20736 |
| 2017/0220506 A1 * | 8/2017 | Brown | | G06F 13/4068 |
| 2017/0339799 A1 * | 11/2017 | Su | | H05K 7/1489 |
| 2018/0317338 A1 * | 11/2018 | Yu | | H05K 7/18 |
| 2018/0350719 A1 * | 12/2018 | Lovicott | | H05K 7/20836 |
| 2019/0059172 A1 * | 2/2019 | Gupta | | H05K 7/1492 |
| 2019/0223321 A1 * | 7/2019 | Zhai | | G06F 1/20 |
| 2019/0371366 A1 * | 12/2019 | Gopalakrishna | | H05K 5/0295 |
| 2020/0068741 A1 * | 2/2020 | Waters | | H05K 7/20145 |

* cited by examiner

CHASSIS AND METHOD FOR MANUFACTURING THE SAME

CROSS REFERENCE TO RELATED APPLICATION

This application claims priority to Chinese Patent Application No. CN201910355155.X, on file at the China National Intellectual Property Administration (CNIPA), having a filing date of Apr. 29, 2019, and having "CHASSIS AND METHOD FOR MANUFACTURING THE SAME" as a title, the contents and teachings of which are herein incorporated by reference in their entirety.

FIELD

Embodiments of the present disclosure generally relate to a computer device, and more specifically to a chassis.

BACKGROUND

In terms of storage device/server hardware design, it is desirable to implement a common hardware design for the purpose of achieving flexibility adapted for different usage requirement and lower manufacturing costs.

Some hardware devices aim to achieve better computing performance often requires more processor chips and memory to be configured. While other part of hardware devices is designed for providing more storage space and the demands for computing capability is not as high as the former. For this type of hardware devices, it is desirable to provide more space to configure a storage device, such as a solid state drive.

The current chassis design cannot simultaneously satisfy the two types of hardware devices with different functional configuration demands.

SUMMARY

Embodiments of the present disclosure aim to provide a chassis to solve problems existing in the prior art.

According to a first aspect of the present disclosure, there is provided a chassis. The chassis includes a housing and a partition. The partition is disposed within the housing and adapted to partition a space inside the housing into a first accommodating portion and a second accommodating portion. The partition is configured to be detachably mounted within the housing and a position of the partition in the housing is adjustable, to change respective volumes of the first accommodating portion and the second accommodating portion.

According to a second aspect of the present disclosure, there is provided a method for manufacturing the chassis according to the first aspect.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Through the following detailed description with reference to the accompanying drawings, the above and other objectives, features and advantages of example embodiments disclosed herein will become more comprehensible. In the drawings, several example embodiments disclosed herein will be illustrated in an example and non-limiting manner, wherein.

In the various figures, the same or corresponding reference numerals indicate the same or corresponding parts.

DETAILED DESCRIPTION

The individual features of the various embodiments, examples, and implementations disclosed within this document can be combined in any desired manner that makes technological sense. Furthermore, the individual features are hereby combined in this manner to form all possible combinations, permutations and variants except to the extent that such combinations, permutations and/or variants have been explicitly excluded or are impractical. Support for such combinations, permutations and variants is considered to exist within this document.

It should be understood that the specialized circuitry that performs one or more of the various operations disclosed herein may be formed by one or more processors operating in accordance with specialized instructions persistently stored in memory. Such components may be arranged in a variety of ways such as tightly coupled with each other (e.g., where the components electronically communicate over a computer bus), distributed among different locations (e.g., where the components electronically communicate over a computer network), combinations thereof, and so on.

Hereinafter, various example embodiments of the present disclosure will be described in detail with reference to the accompanying drawings. It should be noted that the figures and description are merely illustrative of example embodiments. It should be appreciated that alternative embodiments of the structures and methods disclosed herein can easily be envisioned according to the following description, and these alternative embodiments may be used without departing from the principles claimed in the present disclosure.

It should be appreciated that these example embodiments are presented here only to enable those skilled in the art to better understand and then implement the present disclosure, not to limit the scope of the present disclosure in any manner.

As used herein, the term "includes" and its variants are to be read as open terms that mean "includes, but is not limited to." The term "based on" is to be read as "based at least in part on." The term "one implementation" and "an implementation" are to be read as "at least one implementation." The term "another implementation" is to be read as "at least one other implementation." Definitions of other terms will be presented hereunder.

As stated above, in terms of storage device/server hardware design, it is desirable to implement a common hardware design for the purpose of achieving flexibility adapted for different use demands and lower manufacturing costs.

Some hardware devices aim to achieve better computing performance, and they usually need to be configured with more processor chips and memories. Another portion of hardware devices aim to provide more storage space, but their demands for computing capability is not as high as the former. For this type of hardware devices, it is desirable to provide more space to configure a storage device, such as a solid state drive.

Figure 1A:
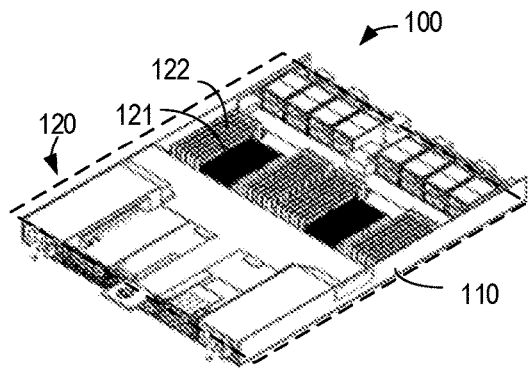
FIGS. 1A to 1D show schematic views of a chassis in a conventional manner.
Figure 1B:
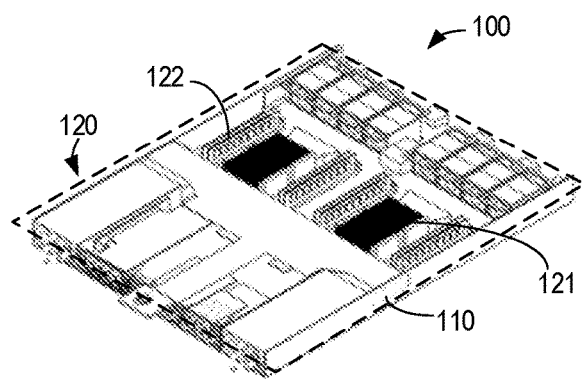

FIGS. 1A to 1D show schematic views of a chassis 100 having a housing 110 in a conventional manner, wherein FIGS. 1A and 1B show schematic views of hardware components for processing a computing process in the chassis 100. As shown in FIGS. 1A and 1B, these hardware components 120 for processing the computing process may include a plurality of central processing unit chips 121, and memories 122 arranged adjacent to the central processing unit chips 121. Compared to FIG. 1A, FIG. 1B has fewer central processing unit chips 121 and memories 122. Therefore, there is a larger free space in FIG. 1B than in FIG. 1A. That is, the hardware component in FIG. 1A is intended to achieve better computing performance than the hardware component in FIG. 1B.

Figure 1C:
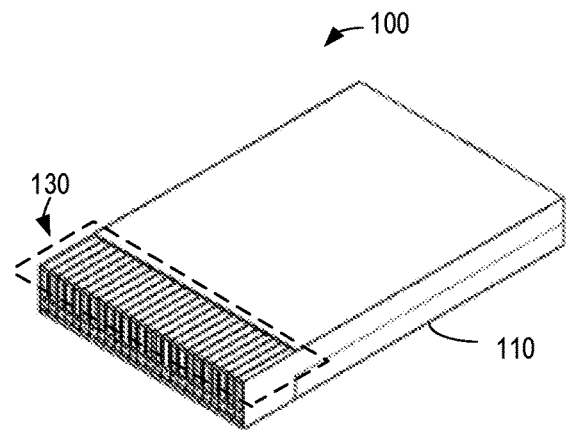
Figure 1D:
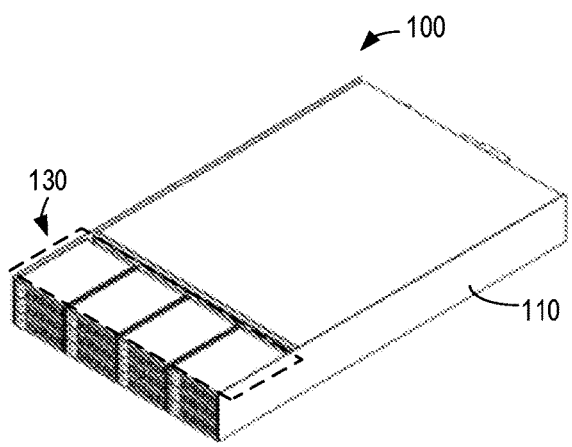

FIGS. 1C and 1D show schematic diagrams of hardware components 130 for storage in the chassis 100, wherein the hardware component 130 for storage in FIG. 1C includes a plurality of 2.5-inch solid state drives, and the hardware component 130 for storage in FIG. 1D includes a plurality of 3.5-inch solid state drives. In contrast to FIG. 1C, the hardware component 130 in FIG. 1D is intended to achieve a larger storage capability.

However, as can be seen from FIG. 1A to FIG. 1D, even if the chassis 100 does not require some space for computing hardware or storage hardware in some cases, the unused space is not allocated to a corresponding space for the storage hardware or computing hardware in the chassis. Because in traditional chassis, the space for the storage hardware and computing hardware is fixed. In other words, the space is not adjusted according to the functional demands of the chassis. This causes a waste of chassis space.

Accordingly, embodiments of the present disclosure provide a chassis which is a common chassis for unused functional configuration requirements, and avoids the waste of space of the chassis due to changes in the volumes of internal electronic components.

Embodiments of the present disclosure will be described in further detail below with reference to FIGS. 2 through 7.

Figure 2:
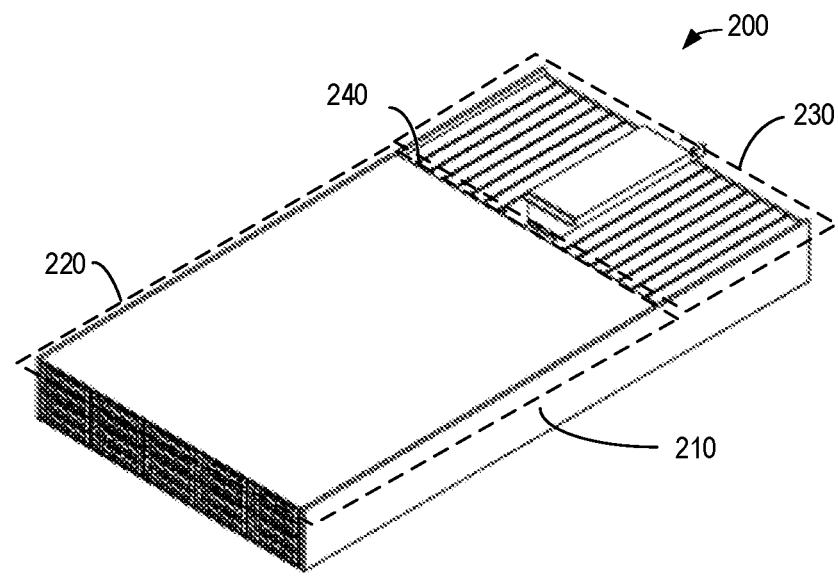
FIG. 2 shows a schematic view of a chassis according to an embodiment of the present disclosure.
Figure 5:
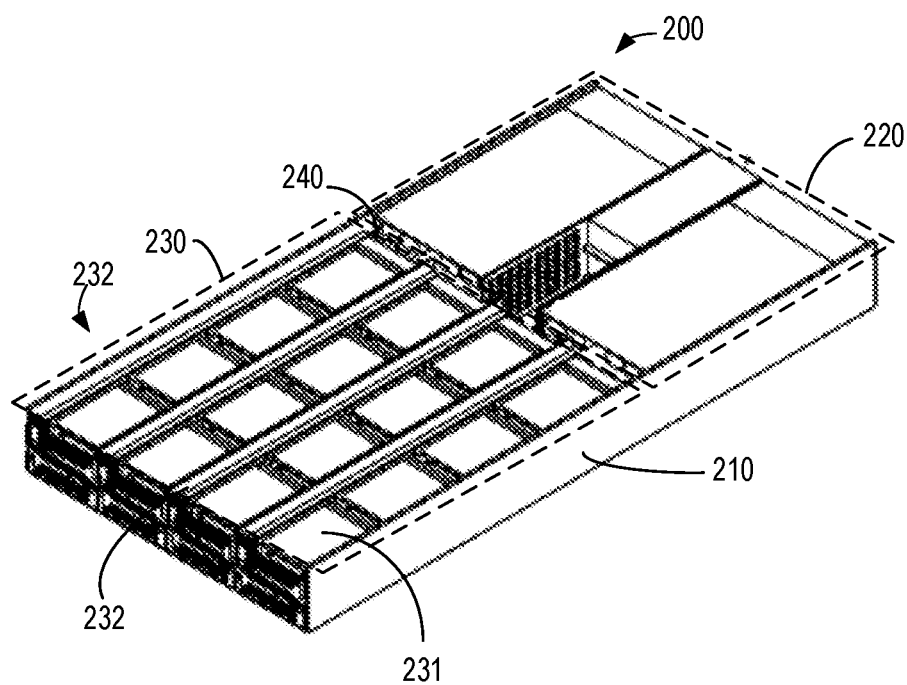
FIG. 5 shows a schematic view of a chassis according to another embodiment of the present disclosure.

FIG. 2 shows a schematic view of a chassis according to an embodiment of the present disclosure. FIG. 5 shows a schematic view of a chassis according to another embodiment of the present disclosure.

As shown in FIGS. 2 and 5, the chassis 220 includes a housing 210 and a partition 240. The partition 240 is disposed within the housing 210 and is adapted to partition a space inside the housing 210 into a first accommodating portion 220 and a second accommodating portion 230. The partition 240 is configured to be detachably mounted within the housing 210 and a position of the partition in the housing 210 is adjustable such that the respective volumes of the first accommodating portion 220 and second accommodating portion 230 can be changed.

For example, a plurality of catch slots adapted for insertion of the partitions 240 may be included at different positions of the side wall of the chassis 200, so that the position of the partition 240 inside the housing 210 may be adjusted to divide different spaces.

In some embodiments, the partition 240 may include an interface for connecting electronic components in the first accommodating portion 220 with electronic components in the second accommodating portion 230.

As can be seen from FIGS. 2 and 5, the volumes of the first accommodating portion 220 and the second accommodating portion 230 in the chassis 200 are significantly different in the two schematic views. In FIG. 2, the first accommodating portion 220 has a larger volume than the second accommodating portion 230. In contrast, in FIG. 5, the first accommodating portion 220 has a volume smaller than the second accommodating portion 230.

In some embodiments, the first accommodating portion 220 is configured to receive a hardware component for processing a computing process in the chassis 200, and the second accommodating portion 230 is configured to receive a hardware component for storage in the chassis 200.

In this way, a common chassis design for different configuration demands is achieved without changing the overall chassis volume.

Figure 3:
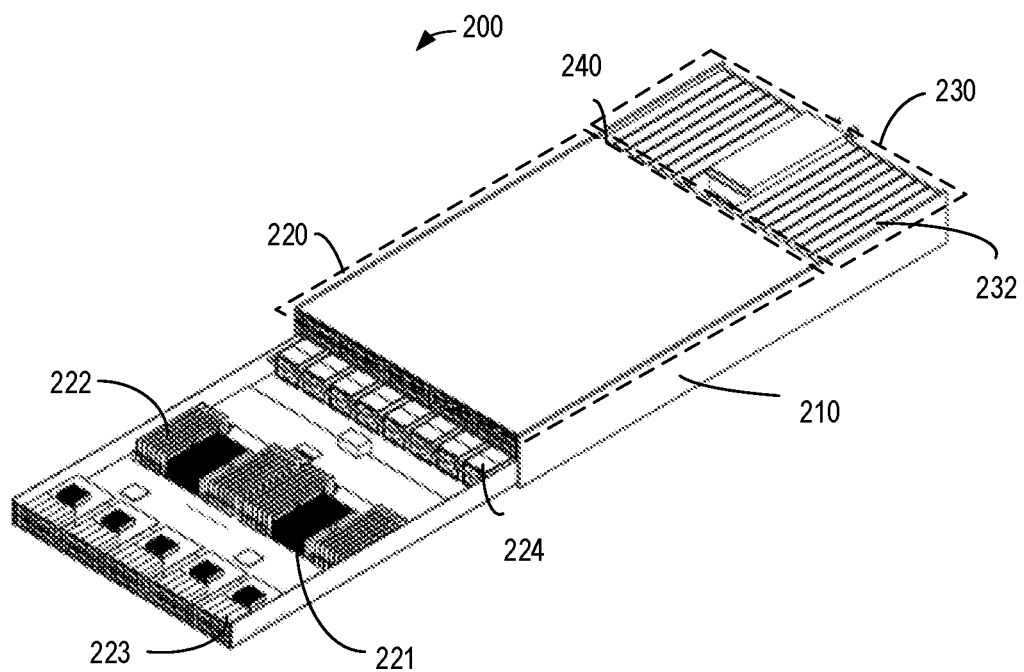
FIG. 3 shows a detailed schematic view of the chassis of the embodiment of FIG. 2.

FIG. 3 shows a schematic diagram of a hardware component for processing a computing process in the chassis 200 of the embodiment of FIG. 2. As shown in FIG. 3, in some embodiments, a central processing unit chip 221 and a memory 222 are disposed in the first accommodating portion 220.

In some embodiments, a plurality of fans 224 are also disposed in the first accommodating portion 220 to cool the central processing unit chip 221 and the memory 222.

Further, although not shown in the figure, the first accommodating portion 220 may further include other heat dissipating devices such as fins disposed near the central processing unit chip 221 and the memory 222.

In some embodiments, an I/O interface 223 is also disposed in the first accommodating portion 220. The I/O interface 223 is arranged to be exposed at an edge of the housing 210 and configured to couple the central processing unit chip 221 with an peripheral device (not shown).

Figure 7:
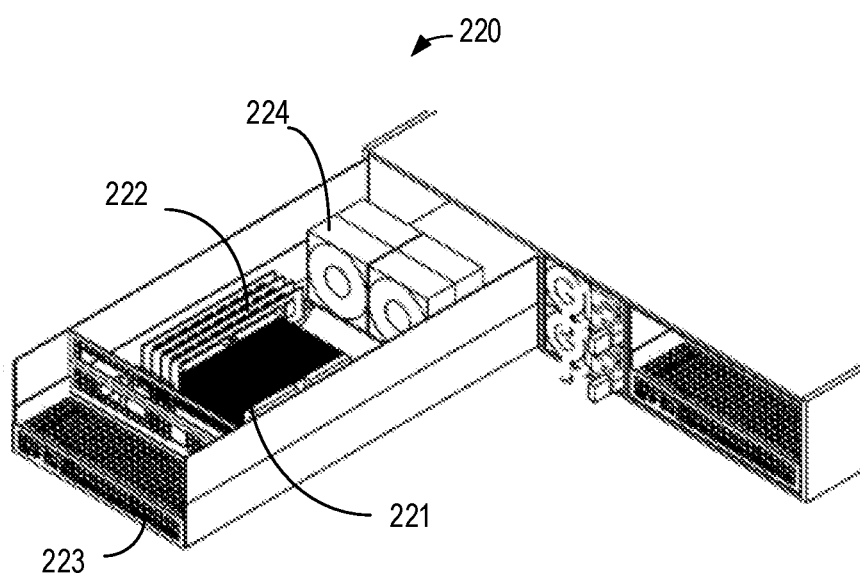
FIG. 7 shows a detailed schematic of the chassis of the embodiment of FIG. 5.

FIG. 7 shows a schematic diagram of a hardware component for processing a computing process in the chassis 200 of the embodiment of FIG. 5. Similarly to FIG. 3, the first accommodating portion 220 shown in FIG. 7 may also include a central processing unit chip 221, a memory 222, a fan 224, and an I/O interface 223.

However, as is apparent from a comparison of FIG. 3 and FIG. 7, the hardware components for processing the computing process in FIG. 7 are far less than the hardware components in FIG. 3. This depends precisely on the chassis 200 shown in FIGS. 2 and 5 having different functional configuration targets.

Figure 4A:
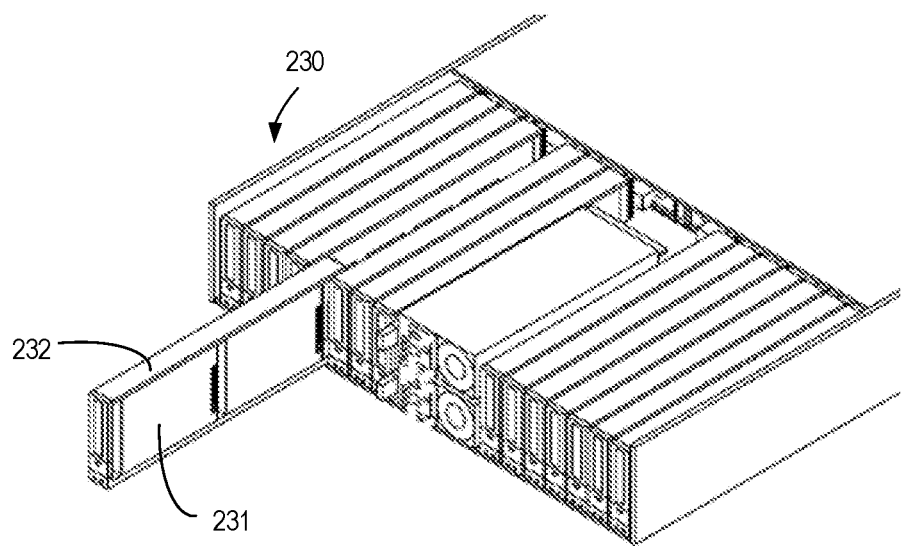
FIGS. 4A and 4B show detailed schematic views of the chassis of the embodiment of FIG. 2.
Figure 4B:
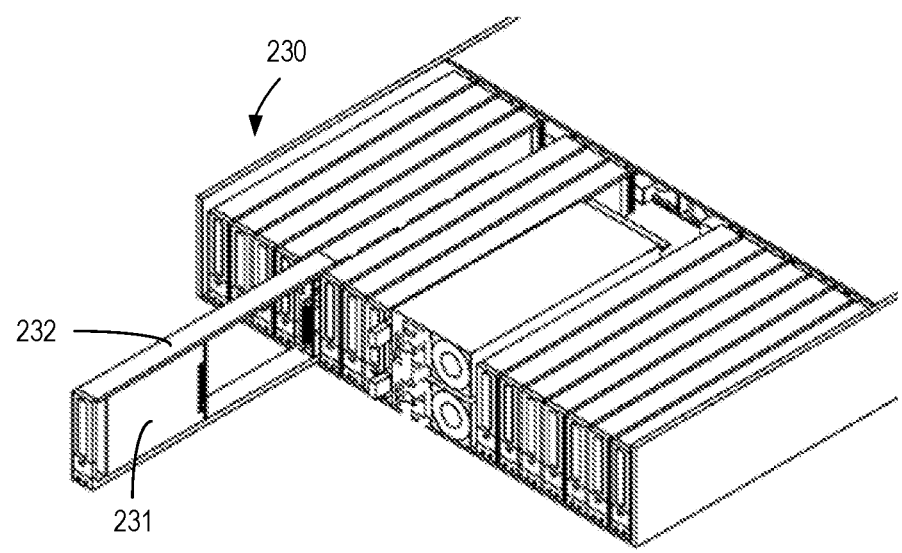
Figure 6:
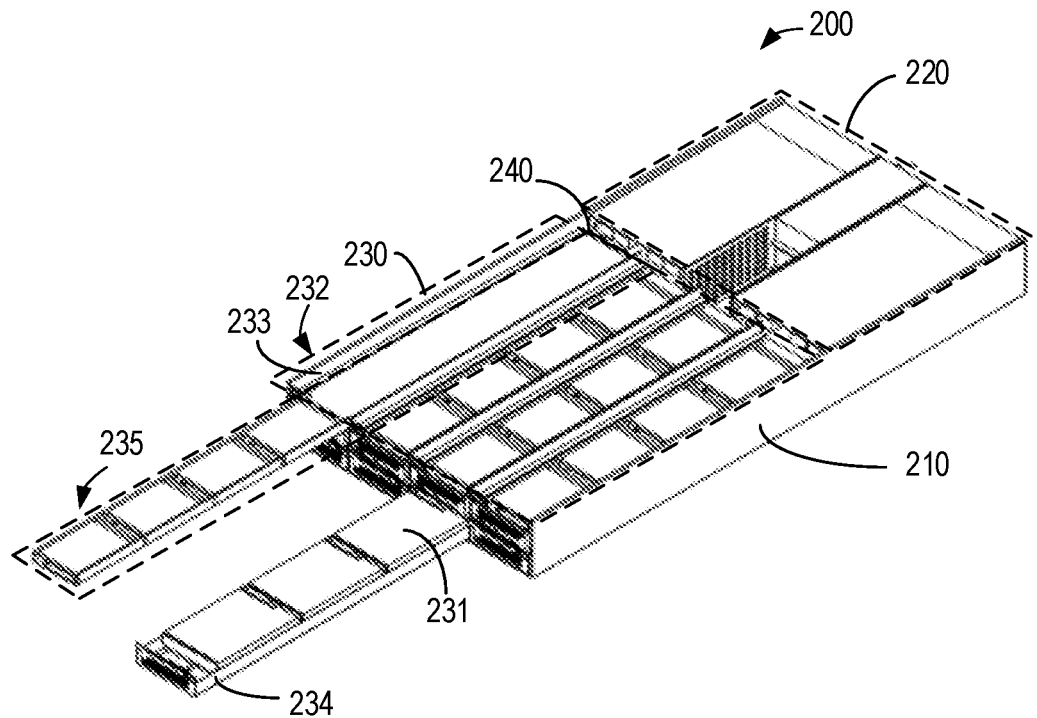
FIG. 6 shows a detailed schematic view of the chassis of the embodiment of FIG. 5.

In addition, FIGS. 4A and 4B show detailed schematic views of hardware components for storage of the chassis 200 of the embodiment of FIG. 2. FIG. 6 shows a detailed schematic diagram of the hardware components for storage of the chassis 200 of the embodiment of FIG. 5.

Referring first to FIG. 6, a disk holder 232 for placing a disk 231 is disposed in the second accommodating portion 230. The disk holder 232 may include a plurality of pull-out accommodating members 235. The plurality of pull-out accommodating members 235 may be configured to be arranged next to each other in the second accommodating portion 230.

In some embodiments, each of the plurality of pull-out accommodating members 235 includes a tray 234 and a sliding rail 233. The tray 234 is configured to receive at least one disk 231 and is adapted to be pushed in and out of the second accommodating portion 230 along the sliding rail 233.

In some embodiments, the tray 234 may be adapted to receive a 2.5-inch solid state drive or a 3.5-inch solid state drive.

Similar to FIG. 6, the second accommodating portion 230 as shown in FIGS. 4A and 4B may include a disk holder 232 for placing a disk 231. Since the volume of the second accommodating portion 230 in FIGS. 4A and 4B is much smaller than the second accommodating portion 230 shown in FIG. 6, the solid state drives accommodated in the disk holder 232 of FIGS. 4A and 4B are much less than those accommodated in the disk holder in FIG. 6. Furthermore, in some embodiments, disks may not be placed at some positions in the disk holder as shown in FIG. 4B.

In this way, it is possible, without changing the appearance and overall architecture of the original chassis, implement a common chassis for different functional configurations by adjusting the position of the partition, thereby avoiding the waste of the space of the chassis to a maximum degree.

In addition, embodiments of the present disclosure further provide a method of manufacturing the above-described chassis. The method includes providing a housing and a partition, the partition being disposed within the housing 210 and adapted to partition a space inside the housing 210 into a first accommodating portion 220 and a second accommodating portion 230.

The method may further include forming a plurality of catch slots on the side wall of the housing, the partition being adapted to inserted into or removed out of an interior of the housing along the catch slot to change the position of the partition in the catch slot, such that the partition 240 is detachably mounted within the housing 210 and its position in the housing 210 is adjustable, thereby changing the respective volumes of the first accommodating portion 220 and the second accommodating portion 230.

In summary, embodiments of the present disclosure provide a common chassis for different functional configuration demands by adjusting the position of the partition, thereby avoiding the waste of space of the chassis due to changes in the volumes of internal electronic components.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

We claim:

1. A chassis comprising:
   a housing; and
   a partition disposed within the housing and adapted to separate a space inside the housing into a first accommodating portion and a second accommodating portion, the partition being configured to be detachably mounted within the housing and a position of the partition in the housing is adjustable, to change respective volumes of the first accommodating portion and the second accommodating portion, wherein the partition comprises an interface for connecting electronic components in the first accommodating portion with electronic components in the second accommodating portion.

2. The chassis according to claim 1, wherein a central processing unit chip and a memory are disposed in the first accommodating portion.

3. The chassis according to claim 2, wherein a plurality of fans are disposed in the first accommodating portion for cooling the central processing unit chip and the memory.

4. The chassis according to claim 2, wherein an I/O interface is disposed in the first accommodating portion, the I/O interface being arranged to be exposed at an edge of the housing and configured to couple the central processing unit chip with a peripheral device.

5. The chassis according to claim 1, wherein a disk holder for placing a disk is disposed in the second accommodating portion.

6. The chassis according to claim 5, wherein the disk holder comprises a plurality of pull-out accommodating members, the plurality of pull-out accommodating members being configured to be arranged next to each other in the second accommodating portion, each of the plurality of pull-out accommodating members comprising a tray and a sliding rail, and the tray being configured to accommodate at least one disk and adapted to be pushed in and out of the second accommodating portion along the sliding rail.

7. The chassis according to claim 6, wherein the tray is adapted to receive a 2.5-inch solid state drive or a 3.5-inch solid state drive.

8. The chassis according to claim 1, including a plurality of catch slots at different positions of side walls of the chassis, the catch slots being adapted for insertion of the partitions at corresponding different positions to provide the adjustable-position detachable mounting of the partition.

9. The chassis according to claim 1, wherein the detachable mounting defines at least first and second configurations in which (1) in the first configuration, the first accommodating portion has a larger volume than the second accommodating portion, and (2) in the second configuration, the first accommodating portion has a volume smaller than the second accommodating portion.

10. A method for manufacturing a chassis comprising:
    providing a housing; and
    disposing a partition within the housing, the partition being adapted to separate a space inside the housing into a first accommodating portion and a second accommodating portion, the partition being configured to be detachably mounted within the housing and a position of the partition in the housing being adjustable, to change respective volumes of the first accommodating portion and the second accommodating portion, wherein the partition comprises an interface for connecting electronic components in the first accommodating portion with electronic components in the second accommodating portion.

11. The method according to claim 10, wherein a central processing unit chip and a memory are disposed in the first accommodating portion.

12. The method according to claim 11, wherein a plurality of fans are disposed in the first accommodating portion for cooling the central processing unit chip and the memory.

13. The method according to claim 11, wherein an I/O interface is disposed in the first accommodating portion, the I/O interface being arranged to be exposed at an edge of the housing and configured to couple the central processing unit chip with a peripheral device.

14. The method according to claim 10, wherein a disk holder for placing a disk is disposed in the second accommodating portion.

15. The method according to claim 14, wherein the disk holder comprises a plurality of pull-out accommodating members, the plurality of pull-out accommodating members being configured to be arranged next to each other in the second accommodating portion, each of the plurality of pull-out accommodating members comprising a tray and a sliding rail, and the tray being configured to accommodate at least one disk and adapted to be pushed in and out of the second accommodating portion along the sliding rail.

16. The method according to claim 15, wherein the tray is adapted to receive a 2.5-inch solid state drive or a 3.5-inch solid state drive.

17. A chassis for use in two hardware products, a first product having a first volume of processing circuitry and a first volume of storage, a second product having a second smaller volume of processing circuitry and a second larger volume of storage, the chassis comprising:

a housing; and a partition disposed within the housing and adapted to separate a space inside the housing into a first accommodating portion for the processing circuitry and a second accommodating portion for the storage, the partition being configured to be detachably mounted within the housing and a position of the partition in the housing is adjustable between first and second positions such that (1) with the partition in the first position the first accommodating portion contains the first volume of processing circuitry and the second accommodating portion contains the first volume of storage, and (2) with the partition in the second position the first accommodating portion contains the second smaller volume of processing circuitry and the second accommodating portion contains the second larger volume of storage, wherein the partition comprises an interface for connecting the processing circuitry in the first accommodating portion with the storage in the second accommodating portion.

* * * * *